(12) United States Patent
Eldredge et al.

(10) Patent No.: US 8,994,420 B2
(45) Date of Patent: Mar. 31, 2015

(54) HIGHER-ORDER PHASE NOISE MODULATOR TO REDUCE SPURS AND QUANTIZATION NOISE

(75) Inventors: Adam B. Eldredge, Austin, TX (US); Xue-Mei Gong, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/469,936

(22) Filed: May 11, 2012

(65) Prior Publication Data

US 2013/0300467 A1 Nov. 14, 2013

(51) Int. Cl.
*H03L 7/06* (2006.01)
*H03L 7/08* (2006.01)

(52) U.S. Cl.
CPC .................................... *H03L 7/08* (2013.01)
USPC ............ 327/156; 327/157; 327/159; 331/1 A; 375/376

(58) Field of Classification Search
USPC ....................... 327/141, 144–163; 331/15–17; 375/373–376
See application file for complete search history.

(56) References Cited

U.S. PATENT DOCUMENTS

| | | | |
|---|---|---|---|
| 6,600,378 B1 * | 7/2003 | Patana | 331/1 A |
| 7,015,738 B1 * | 3/2006 | Cao | 327/159 |
| 7,181,180 B1 * | 2/2007 | Teo et al. | 455/260 |
| 7,417,510 B2 * | 8/2008 | Huang | 331/74 |
| 7,486,145 B2 * | 2/2009 | Floyd et al. | 331/1 A |
| 7,602,252 B2 * | 10/2009 | Sakai | 331/1 A |
| 8,248,175 B2 * | 8/2012 | Hara | 331/179 |
| 2002/0121938 A1 * | 9/2002 | Fan | 331/16 |
| 2004/0247027 A1 * | 12/2004 | Wang | 375/239 |
| 2007/0205831 A1 * | 9/2007 | Yoshikawa et al. | 331/16 |
| 2008/0084247 A1 * | 4/2008 | Sakai | 331/18 |
| 2008/0164917 A1 * | 7/2008 | Floyd et al. | 327/117 |
| 2012/0169387 A1 * | 7/2012 | Hara | 327/156 |

OTHER PUBLICATIONS

Hamoui, Anas A., et al., "Digitally-Enhanced 2nd Order ΔΣ Modulator with Unity-Gain Signal Transfer Function," IEEE International Symposium on Circuits and Systems 2008 (ISCAS 2008), May 18-21, 2008, pp. 1664-1667.

* cited by examiner

Primary Examiner — Brandon S Cole
(74) Attorney, Agent, or Firm — Abel Law Group, LLP

(57) ABSTRACT

A frequency synthesizer capable of generating a clock signal having reduced digital spurs and reduced jitter is described. An apparatus includes a frequency modulator configured to generate a divide control signal and a digital quantization error signal in response to a divide ratio. The apparatus includes a phase modulator configured to generate a phase error signal based on the digital quantization error signal. The phase modulator is an n-order sigma-delta modulator module, n being an integer greater than one. The apparatus may include an interpolative divider configured to generate a feedback signal in a phase-locked loop (PLL) based on an output signal of the PLL, the divide control signal, and the phase error signal. The interpolative divider may include the frequency modulator and the phase modulator. The phase modulator may have a unity gain signal transfer function.

17 Claims, 7 Drawing Sheets

HIGHER-ORDER PHASE NOISE MODULATOR TO REDUCE SPURS AND QUANTIZATION NOISE

BACKGROUND

1. Field of the Invention

This invention relates to generating clock signals for electronic devices.

2. Description of the Related Art

Clock synthesizers generate clock signals utilized by a wide variety of electronic products. Referring to FIG. 1, a typical clock synthesizer utilizes a phase-locked loop (PLL) supplied with a reference signal from a source such as a crystal oscillator. The output frequency of the signal supplied by the synthesizer can be determined by a divider value of the feedback divider in the PLL. Thus, a reference frequency supplied to the PLL is multiplied based on the divider value to generate the synthesized clock frequency. For example, feedback divider 118 of PLL 100 may be an integer divider, which divides the reference frequency clock signal by an integer value, N.

FIG. 2A illustrates a PLL 100 with a fractional-N feedback divider 119. In at least one embodiment, DIVIDE RATIO is a digital frequency ratio translated from a code, e.g., a code provided by non-volatile memory (NVM). Sigma-delta modulator 121 supplies a divide sequence to fractional-N feedback divider 119. Fractional-N divider 119 receives a divide value sequence corresponding to the target divider ratio. For example, FIG. 2B illustrates a timing diagram of a divide by 2.25. The input clock (REFCLK) is shown as waveform 201 as having a period of one unit interval (UI). The output of the fractional-N divider, DIVCLK, is shown in waveform 203. As shown in waveform 203, the divide ratio of 2.25 is achieved by a sequence of divide by 2 for three periods and a divide by 3 for one period, assuming a first order sigma-delta modulator is used to control the fractional-N divider. Waveform 205 illustrates the ideal waveform for a divide ratio of 2.25. The quantization noise of the modulator, at the output of the divider 118 is shown as the difference at 207, 209, and 211, between the actual output of the fractional-N divider shown in waveform 203 and the ideal output for a divide by 2.25 shown in waveform 205.

Referring back to FIG. 2A, fractional-N divider 119 supplies the divided signal to phase detector 112 with noise associated with the nature of the fractional-N divider. In fractional-N synthesis, the fractional-N noise may be filtered out by the PLL loop. In addition, phase error correction may be utilized to address the jitter introduced by the divider by introducing an offset into the PLL corresponding to the jitter generated by the fractional-N divider. However, such clock synthesizers may require a complex loop filter and complex voltage-controlled oscillator control that increase the cost in design effort and chip area, resulting in more expensive products that may be too expensive in cost or real estate for significant portions of the clock synthesizer market. Accordingly, low-cost, low-noise, flexible clock synthesizer techniques are desired.

SUMMARY OF EMBODIMENTS OF THE INVENTION

In at least one embodiment of the invention, an apparatus includes a frequency modulator configured to generate a divide control signal and a digital quantization error signal in response to a divide ratio. The apparatus includes a phase modulator configured to generate a phase error signal based on the digital quantization error signal. The phase modulator is an n-order sigma-delta modulator module, n being an integer greater than one. The apparatus may include an interpolative divider configured to generate a feedback signal in a phase-locked loop (PLL) based on an output signal of the PLL, the divide control signal, and the phase error signal. The interpolative divider may include the frequency modulator and the phase modulator. The phase modulator may have a unity gain signal transfer function.

In at least one embodiment of the invention, a method includes receiving a divide ratio in a sigma-delta modulator and generating an integer portion and a digital quantization error corresponding to the divide ratio. The method includes supplying the integer portion as a divide control signal to an interpolative divider in a feedback loop of a phase-locked loop (PLL). The method includes receiving the digital quantization error in a multi-order sigma-delta modulator and generating a phase error signal corresponding to the digital quantization error. The method includes supplying the phase error signal to the interpolative divider. The multi-order sigma-delta modulator may have a unity gain signal transfer function.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
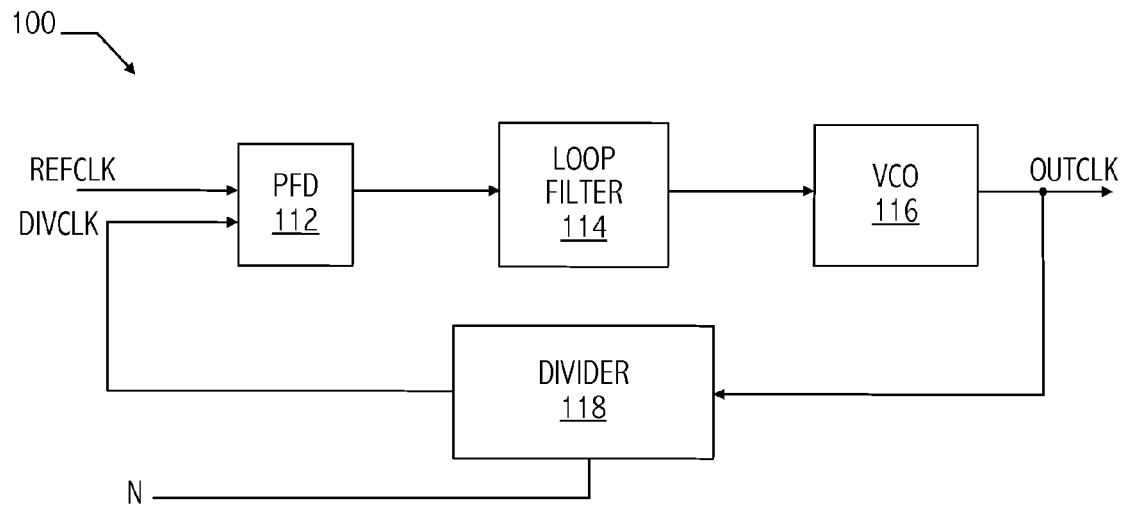
FIG. 1 illustrates a functional block diagram of a phase-locked loop including an integer frequency divider.
Figure 2A:
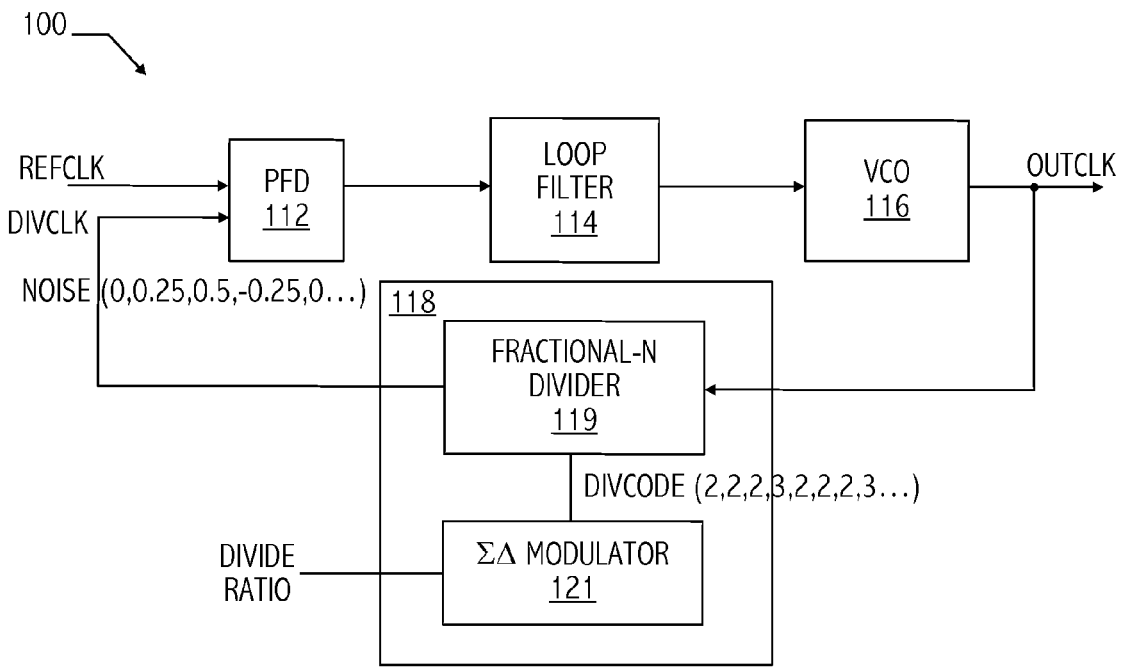
FIG. 2A illustrates a functional block diagram of a phase-locked loop including a fractional-N frequency divider.
Figure 2B:
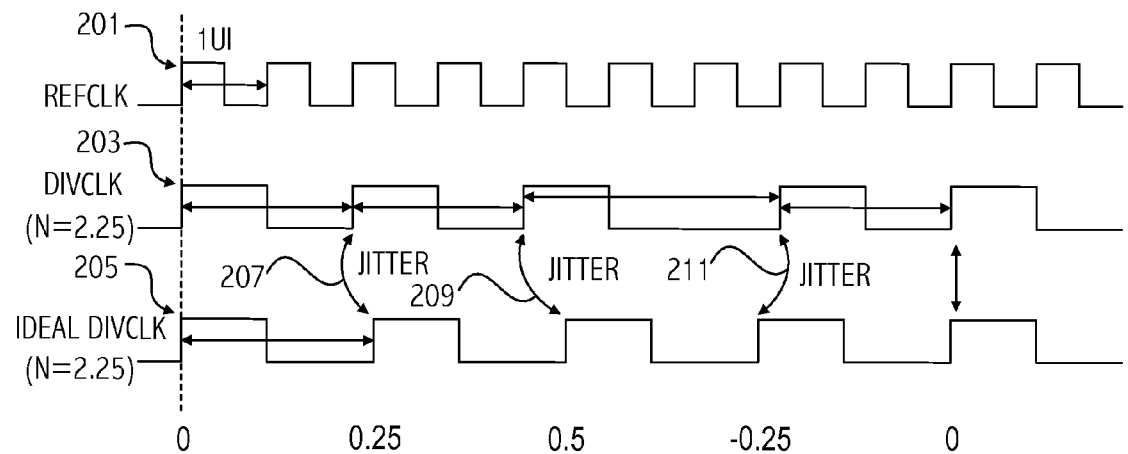
FIG. 2B illustrates timing waveforms for the phase-locked loop of FIG. 2A.

Referring to FIG. 2A, PLL 100 includes a phase/frequency detector (PFD) 112, a loop filter 114, and a voltage controlled oscillator (VCO) 116. Loop filter 114 may be implemented as a digital loop filter to avoid the necessity of off-chip capacitors. VCO 112 may be implemented as a ring oscillator or as an LC oscillator. Other oscillator structures may also be utilized. PFD 112 receives a reference clock signal, which can come from a fixed source such as a crystal oscillator or micro electro mechanical structure (MEMS) oscillator. A non-volatile memory (not shown) may supply a divide ratio to divider 118, which is in the feedback path of PLL 100.

Figure 3:
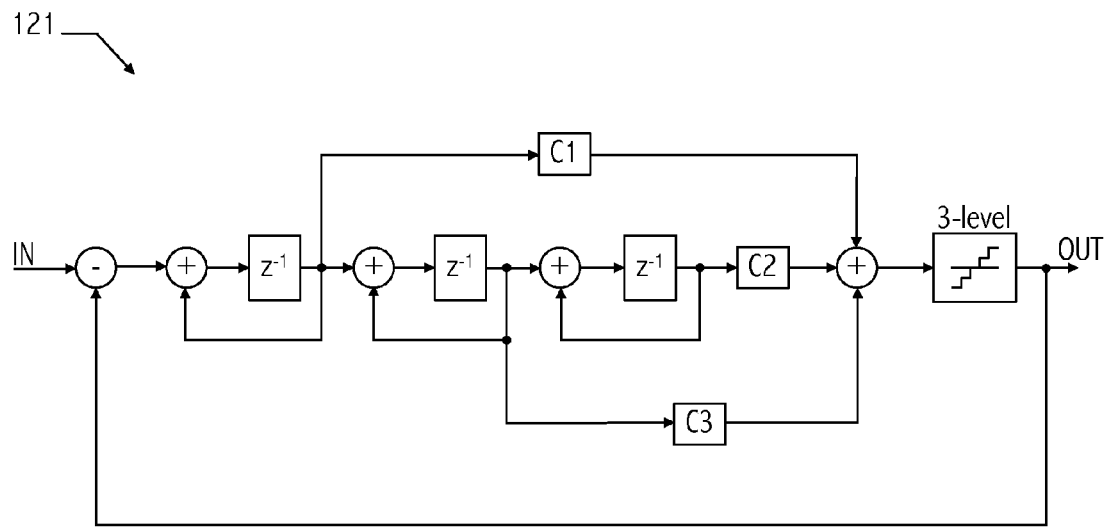
FIG. 3 illustrates a functional block diagram of a third-order sigma-delta modulator of the PLL of FIG. 2A.

Divider 118 includes sigma-delta modulator 121, which is a typical first-order sigma-delta modulator. As discussed above, fractional-N divider 119 introduces a digital quantization error that causes phase noise (i.e., jitter) in the feedback clock signal DIVCLK. An exemplary technique for reducing or cancelling the phase noise introduced into the feedback signal of phase-locked loop (PLL) 100 by fractional-N divider 119 includes use of a higher-order sigma-delta modulator to generate the divider control signal DIVCODE. FIG. 3 illustrates exemplary third-order sigma-delta modulator 121 that can be used to generate the DIVCODE for fractional-N divider 119 of FIG. 2A. The resulting PLL requires a high update rate, which increases the cost of the reference clock. In addition, the resulting PLL requires a highly linear phase detector and charge pump to prevent quantization noise from being mixed down to DC.

Figure 4:
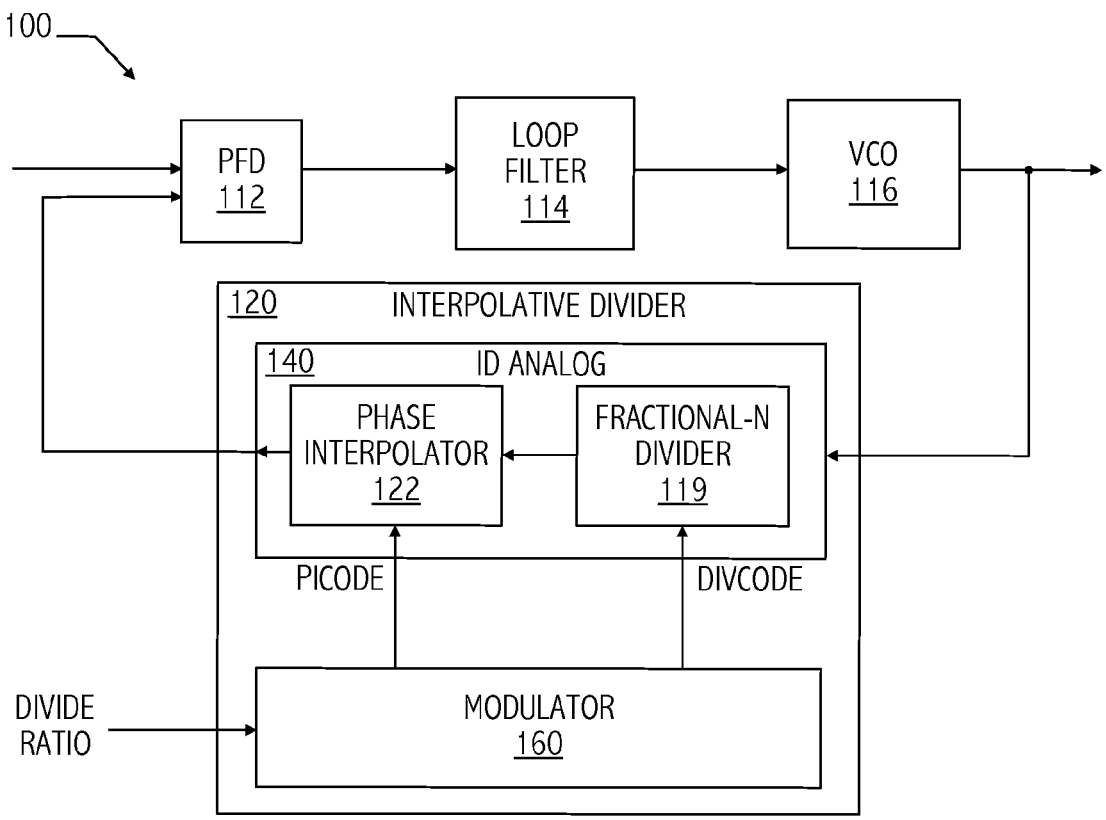
FIG. 4 illustrates a functional block diagram of a PLL including an interpolative divider.

Referring to FIG. 4, another technique for reducing jitter in a fractional-N divider includes adjusting the phase of the frequency-divided signal according to a phase error control signal, PICODE, generated by interpolative divider 120. Interpolative divider 120 includes phase interpolator 122 that interpolates the phase of the output of fractional-N divider 119 thereby introducing a phase adjustment prior to phase detector 112 of PLL 100. Modulator module 160 generates the DIVCODE for fractional-N divider 119. In addition, modulator module 160 generates PICODE and supplies it to phase interpolator 122. Phase interpolator 122 interpolates between the frequency-divided signal and one or more delayed versions of the frequency-divided signal (one or more equally spaced phases of the frequency-divided signal) based on the PICODE, which corresponds to the phase error, using techniques that are well known in the art. Interpolative divider 120 provides the output of phase interpolator 122 to phase detector 112.

Figure 5:
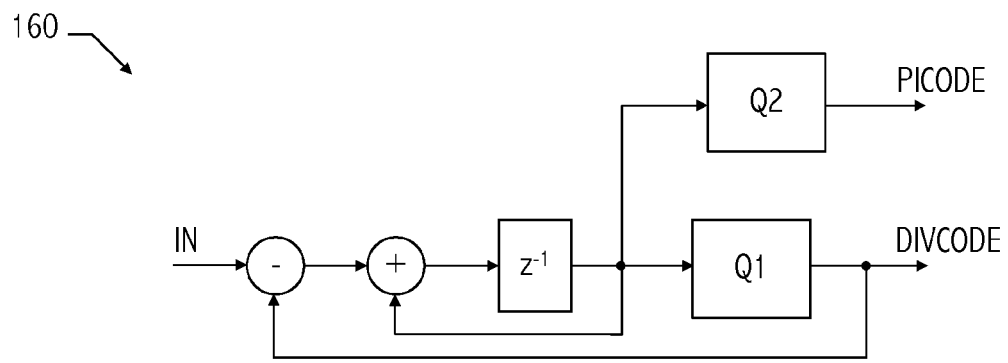
FIG. 5 illustrates a functional block diagram of a modulator module of the interpolative divider of FIG. 4.

An exemplary modulator module 160 includes a first-order sigma-delta modulator that may be implemented in digital circuitry (e.g., using digital delay elements, adders, comparators, etc.). Referring to FIG. 5, sigma-delta modulator 161 generates both the PICODE and the DIVCODE. The DIVCODE is a truncated version (i.e., integer portion) of the integrator output signal and the PICODE (which corresponds to the digital quantization error) is the truncated portion (i.e., fractional portion) of the integrator output signal. In at least one embodiment, DIVCODE is a one-bit code having a range of integer values 0≤DIVCODE≤1 and the PICODE is an eight-bit code, having a range of values of 0≤PICODE≤($2^8$ −1). The phase error associated with first-order frequency modulator 122 is uniformly distributed. Phase interpolator 122 uses the PICODE to reduce or eliminate the phase error before phase detector 112, thereby reducing the linearity requirements on phase detector 112. However, quantization error from the phase interpolator digital-to-analog conversion introduces spurs into the feedback signal. Linearity and gain error of phase interpolator 122 introduces spurs and high jitter.

Figure 6:
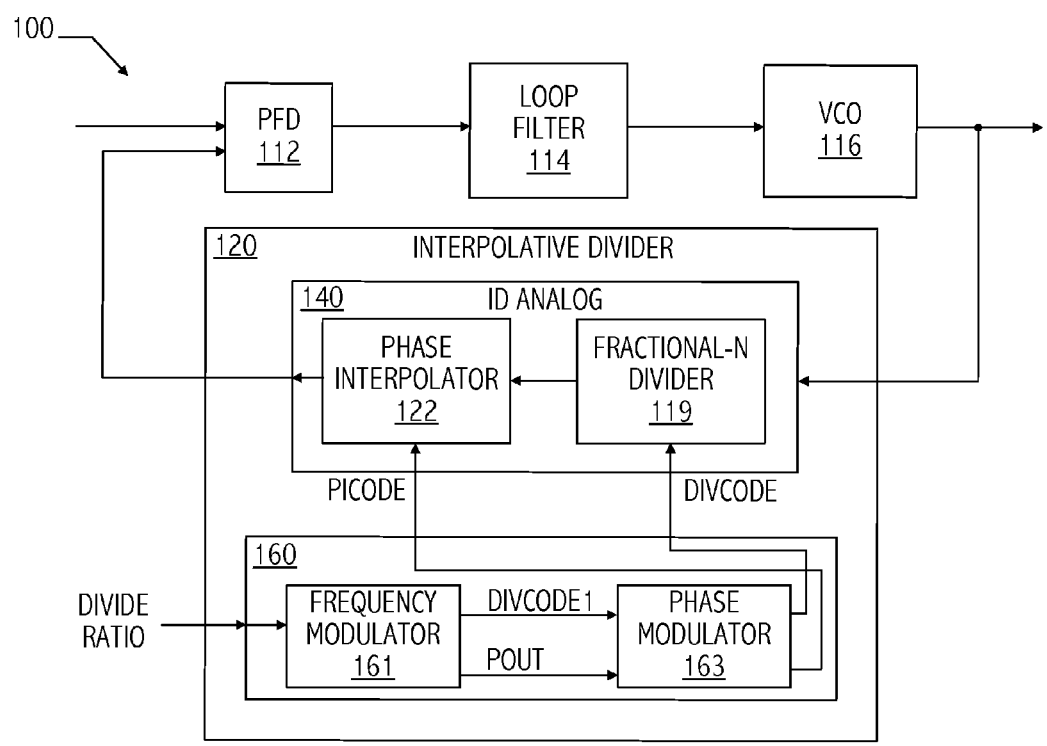
FIG. 6 illustrates a functional block diagram of a PLL including an interpolative divider having a frequency modulator and a phase modulator consistent with at least one embodiment of the invention.

Referring to FIG. 6, rather than use a single first-order sigma-delta modulator to generate the DIVCODE and PICODE, a technique for reducing spurs and quantization noise includes using frequency modulator 161 to generate the DIVCODE1, which corresponds to an integer portion of the divide ratio. In addition, frequency modulator 161 generates a high-resolution (e.g., greater than eight bits) phase error signal POUT that corresponds to the quantization error associated with the DIVCODE. Phase modulator 163 includes a higher-order sigma-delta modulator that generates a lower-resolution PICODE based on that quantization error signal. That is, phase modulator 163 receives POUT having a number of bits that is much greater than the number of bits in PICODE (e.g., eight bits). In at least one embodiment, frequency modulator 161 includes a first-order sigma-delta modulator and phase modulator 163 includes a higher-order (i.e., at least second order) sigma-delta modulator. However, frequency modulator 161 and phase modulator 163 can have higher orders.

Typical higher-order sigma delta modulators attenuate high-frequency energy of the signal (i.e., the signal transfer function (STF) is a low-pass filter) and shape the noise (i.e., the noise transfer function (NTF) pushes noise energy into higher frequencies). Typical applications take advantage of those characteristics of higher-order sigma-delta modulators. By low-pass filtering the signal, high-frequency signal information is lost and results in increased jitter seen by the phase detector 112. In low-bandwidth applications, the information represented by the high-frequency energy of the signal is not needed. However, in high-bandwidth applications, the high-frequency signal information is needed to generate a phase error signal indicative of the phase noise. If the high-frequency components of the quantization error signal are attenuated or lost, the phase error signal, PICODE, will not track high-frequency jitter, and the system will not achieve target output specifications for high-bandwidth applications. Therefore, in order to maintain the high-frequency signal information, phase modulator 163 has a high-bandwidth signal-transfer function. Phase modulator 163 has a signal-transfer function that does not substantially attenuate the signal in a frequency band-of-interest. In at least one embodiment, phase modulator 163 has a unity gain signal-transfer function (i.e., |STF|=1). Any zeros in the signal transfer function (STF) of a unity gain signal transfer function reside at the origin. Any noise energy that has been pushed into high frequencies by phase modulator 163 is filtered by loop filter 114. Note that phase modulators having other signal transfer functions may be used in applications that can tolerate any associated increase in quantization error. In addition, note that although phase modulator 163 has been described in a particular phase-locked loop system, one of skill in the art will appreciate that the teachings herein can be utilized with other closed-loop systems or in open-loop systems that include a high quality factor (i.e., high Q) filter or can tolerate high-frequency noise.

Referring to FIGS. 5 and 6, in at least one embodiment, frequency modulator 161, is implemented by first-order sigma-delta modulator 160 of FIG. 5. In at least one embodiment, a dither signal is introduced in frequency modulator 161. However, a dither signal may be introduced in phase modulator 163. Frequency modulator 161 provides the phase error signal, which is the output of quantizer Q2 of frequency modulator 160, to phase modulator 163 as POUT, and provides the output of quantizer Q1 of frequency modulator 160, to phase modulator 163 as DIVCODE1. Note that in other embodiments, frequency modulator 161 has a different first-order, or a higher-order, sigma-delta configuration. However, note that increasing the order of sigma-delta modulator in frequency modulator 161 may not improve the phase noise if the order of sigma-delta modulator in the phase modulator 163 is not also increased.

Referring back to FIG. 6, phase modulator 163 includes a sigma-delta modulator having an order greater than one and having a wideband signal transfer function (e.g., a unity gain signal transfer function, i.e., |STF|=1). In general, a higher-order sigma-delta modulator adds one or more additional loops to a basic first-order section of a sigma-delta modulator. Each of the additional loops includes an integrator. As the order of the sigma-delta modulator increases, correlation of the quantization noise decreases and consequently decreases the power of any spurs in the feedback signal generated by interpolative divider 120. In addition, use of the higher-order modulator may reduce the probability of repeated patterns resulting in fewer spurs in the feedback signal generated by interpolative divider 120.

Figure 7:
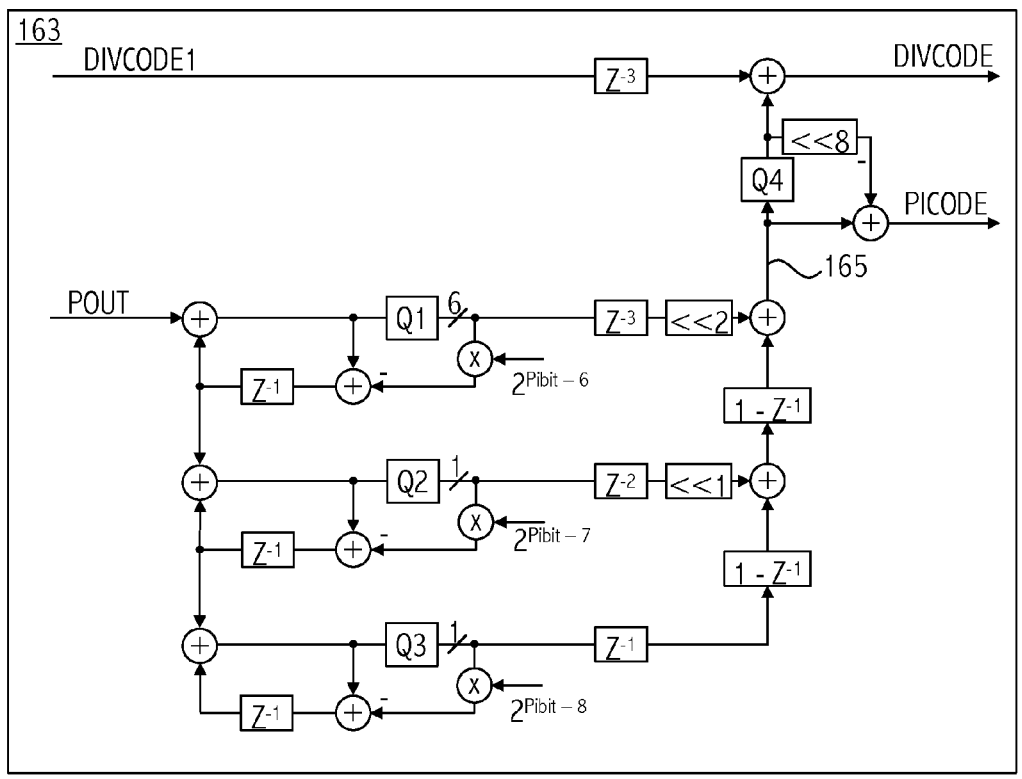
FIG. 7 illustrates a functional block diagram of a phase modulator module having a multi-stage noise shaping (MASH) 111 configuration consistent with at least one embodiment of the invention.

In at least one embodiment, phase modulator 163 has a multi-stage noise shaping (MASH) architecture. Referring to FIG. 7, phase modulator 163 may be a third-order sigma-delta modulator having a MASH 111 configuration. For example, at node 165:

$$STF = z^{-3}, \text{ and}$$

$$NTF = (1-z^{-1})^3 \times z^{-3},$$

where z is a complex variable. The three zeros at the origin in the signal transfer function correspond to a phase delay of three unit intervals. Accordingly, phase modulator 163 delays DIVCODE1 by three unit intervals to maintain correspondence between the output DIVCODE and PICODE. Phase modulator 163 combines an integer portion of the quantized phase error with the DIVCODE1 to form the DIVCODE that is provided to fractional-N divider 119 and the fractional portion of the quantized phase error is provided to the phase interpolator 122 as PICODE. Quantizers Q1, Q2, Q3, and Q4 and multiplication by constants (e.g., by multiplicative shifts) provide outputs having a number of bits that result in a target PICODE precision (e.g., 8-bits). Note that in other embodiments, the target precision of the PICODE varies and the number of bits provided by quantizers Q1, Q2, Q3, and Q4 and the multiplicative constants vary accordingly to align data and maintain precision after quantization.

Figure 8:
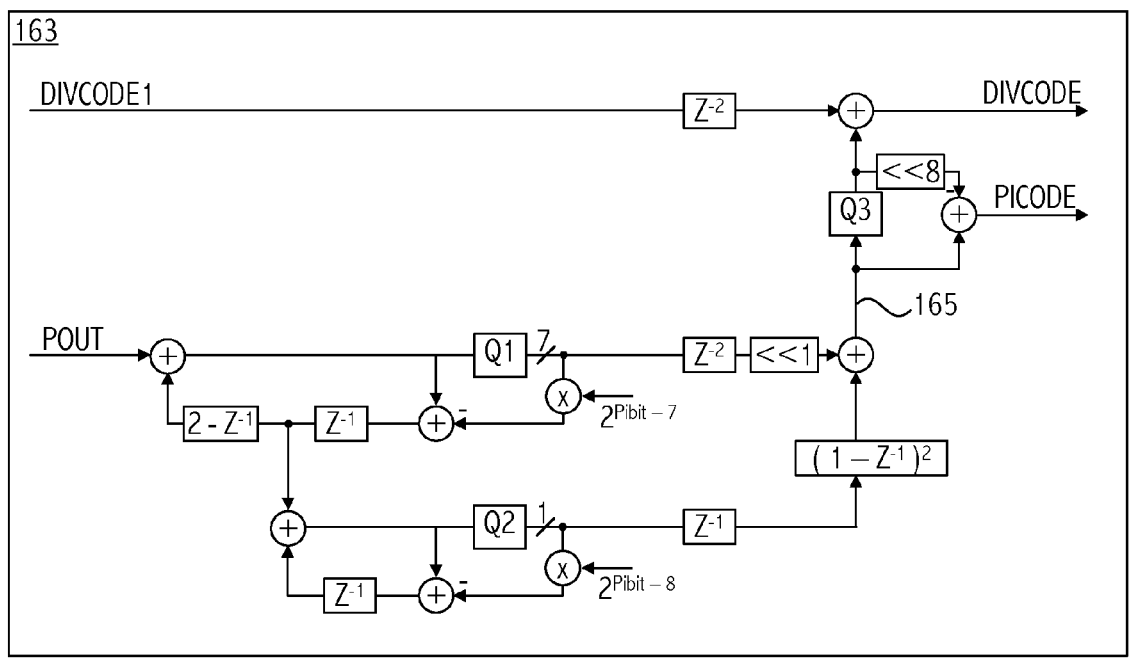
FIG. 8 illustrates a functional block diagram of a phase modulator module having a MASH 21 configuration consistent with at least one embodiment of the invention.

Referring to FIG. 8, in at least one embodiment, phase modulator 163 is a third-order sigma-delta modulator having a MASH 21 configuration. For example, at node 165:

$$STF = z^{-2}, \text{ and}$$

$$NTF = (1-z^{-1})^3 \times z^{-2}.$$

The two zeros at the origin in the signal transfer function correspond to a phase delay of two unit intervals. Accordingly, phase modulator 163 delays DIVCODE1 by two unit intervals to maintain correspondence between the output DIVCODE and PICODE. Phase modulator 163 combines an integer portion of the quantized phase error with DIVCODE1 to form the DIVCODE that is provided to fractional-N divider 119 and the fractional portion of the quantized phase error is provided to phase interpolator 122 as PICODE. Quantizers Q1, Q2, and Q3 and multiplication by constants (e.g., by multiplicative shifts) provide outputs having a number of bits that result in a target PICODE precision (e.g., 8-bits). Note that in other embodiments, the target precision of the PICODE varies and the number of bits provided by quantizers Q1, Q2, and Q3, and the multiplication by constants vary accordingly to align data and maintain precision after quantization.

Figure 9:
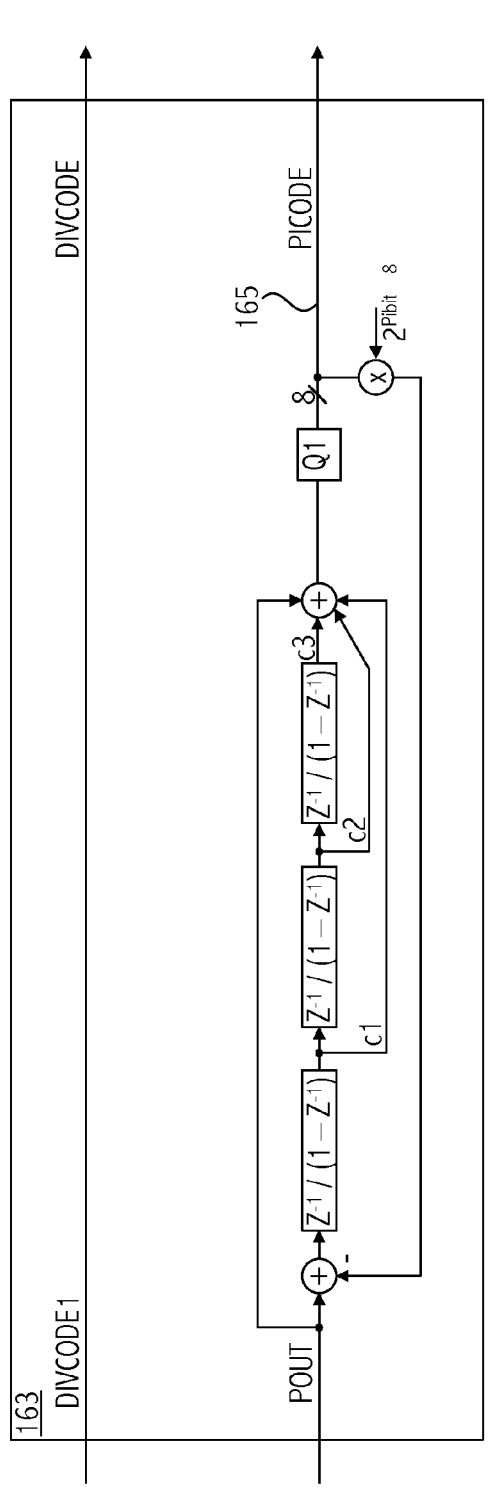
FIG. 9 illustrates a functional block diagram of a phase modulator module having a third-order feedforward configuration consistent with at least one embodiment of the invention.

Referring to FIG. 9, in at least one embodiment, phase modulator 163 is a third-order sigma-delta modulator having a feedforward configuration. For example, at node 165:

$$STF = 1, \text{ and}$$

$$NTF = c1 \times \frac{z^{-1}}{(1-z^{-1})} + c2 \times \left(\frac{z^{-1}}{(1-z^{-1})}\right)^2 + c3 \times \left(\frac{z^{-1}}{(1-z^{-1})}\right)^3,$$

$$c1 = 2, c2 = 1.5, c3 = 0.5.$$

In this embodiment, frequency modulator 163 provides DIVCODE1 as DIVCODE. Quantizer Q1 and multiplication by a constant (e.g., by multiplicative shift) provide outputs having a number of bits that result in a target PICODE precision (e.g., 8-bits). Note that in other embodiments, the target precision of the PICODE varies and the number of bits provided by quantizer Q1 and the multiplication by a constant vary accordingly to align data and maintain precision after quantization.

Figure 10:
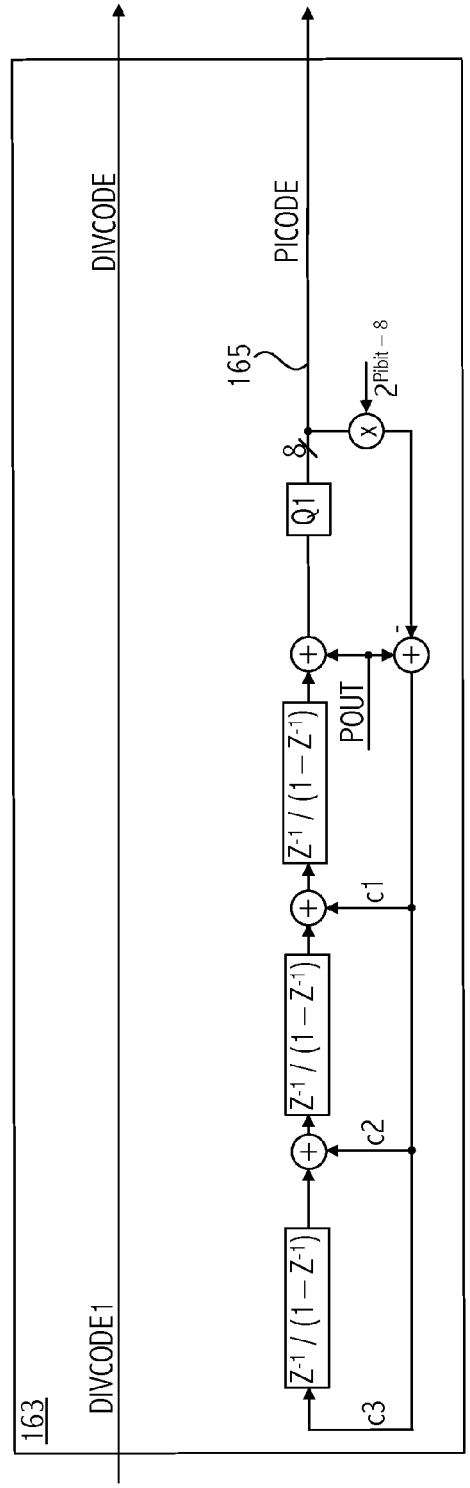
FIG. 10 illustrates a functional block diagram of a phase modulator module having a third-order feedback configuration consistent with at least one embodiment of the invention.

Referring to FIG. 10, in at least one embodiment, phase modulator 163 is a third-order sigma-delta modulator having a feedback configuration. For example, at node 165:

$$STF = 1, \text{ and}$$

$$NTF = c1 \times \frac{z^{-1}}{(1-z^{-1})} + c2 \times \left(\frac{z^{-1}}{(1-z^{-1})}\right)^2 + c3 \times \left(\frac{z^{-1}}{(1-z^{-1})}\right)^3,$$

$$c1 = 2, c2 = 1.5, c3 = 0.5.$$

In this embodiment, frequency modulator 163 provides DIVCODE1 as DIVCODE. Quantizer Q1 and multiplication by constant (e.g., by multiplicative shift) provide outputs having a number of bits that result in a target PICODE precision (e.g., 8-bits). Note that in other embodiments, the target precision of the PICODE varies and the number of bits provided by quantizer Q1 and the multiplication by constant vary accordingly.

Figure 11:
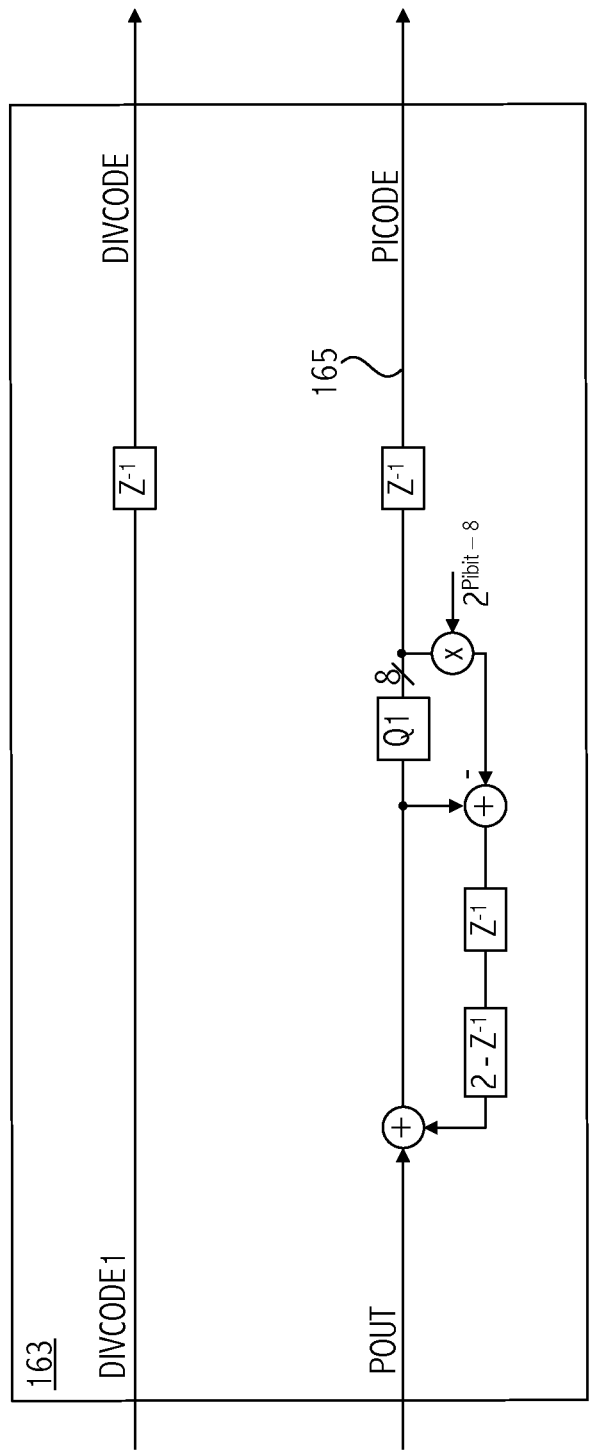
FIG. 11 illustrates a functional block diagram of a phase modulator module having a second-order feedback configuration consistent with at least one embodiment of the invention.

Referring to FIG. 11, in at least one embodiment, phase modulator 163 is a second-order modulator having a feedback configuration. At node 165:

$$STF = z^{-1}, \text{ and}$$

$$NTF = (1-z^{-1})^2 \times z^{-1}.$$

The zero at the origin in the signal transfer function corresponds to a phase delay of one unit interval. Accordingly, phase modulator 163 delays DIVCODE1 by one unit interval to maintain correspondence between the output DIVCODE and PICODE. Quantizer Q1 and multiplication by a constant (e.g., by multiplicative shift) provide outputs having a number of bits that result in a target PICODE precision (e.g., 8-bits). Note that in other embodiments, the target precision of the PICODE varies and the number of bits provided by quantizer Q1 and the multiplicative constants vary accordingly to align data and maintain precision after quantization. The embodiments of phase modulator 163 illustrated in FIGS. 8-12 are exemplary only and techniques described herein apply to other wideband modulator embodiments having an order greater than one.

Thus, embodiments of a frequency synthesizer capable of generating a clock signal having reduced digital spurs and reduced jitter have been described. While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in an embodiment in which a first-order frequency modulator is used, one of skill in the art will appreciate that the teachings herein can be utilized with higher-order frequency modulators having other configurations. Variations and modifications of the embodiments disclosed herein may be made based on the description set forth herein, without departing from the scope and spirit of the invention as set forth in the following claims.

What is claimed is:

1. An apparatus comprising:
    a fractional-N divider in a feedback path of a phase-locked loop (PLL) responsive to an output of the PLL and a divide control signal to generate a frequency-divided version of the output of the PLL;
    a phase interpolator in the feedback path of the PLL responsive to the frequency-divided version of the output of the PLL and a phase interpolation control signal to generate a phase-adjusted version of a feedback signal of the PLL;
    a frequency modulator comprising a first sigma-delta modulator configured to generate a second divide control signal and a digital quantization error signal in response to a digital divide ratio, the divide control signal being based on the second divide control signal; and
    a phase modulator comprising a second sigma-delta modulator configured to generate the phase interpolation control signal based on the digital quantization error, the second sigma-delta modulator having a high bandwidth signal transfer function and being an n-order sigma-delta modulator module, n being an integer greater than one.

2. The apparatus, as recited in claim 1, wherein the phase modulator is configured to delay the divide control signal to synchronize the divide control signal and the phase error signal.

3. The apparatus, as recited in claim 1, wherein the phase modulator is further configured to generate the output divide control signal, the output divide control signal being based on a combination of an integer portion of a quantized phase error signal and the divide control signal.

4. The apparatus, as recited in claim 1, wherein the signal transfer function of the phase modulator is unity gain.

5. The apparatus, as recited in claim 1, wherein the first sigma-delta modulator is a first-order sigma-delta modulator and the second sigma-delta modulator is a second order sigma-delta modulator.

6. The apparatus, as recited in claim 1, wherein the divide control signal is based on the second divide control signal and the digital quantization error.

7. A method comprising:
    generating a frequency-divided version of the output of a phase-locked loop (PLL) responsive to an output of the PLL and a divide control signal;
    generating a phase-adjusted version of a feedback signal of the PLL responsive to the frequency-divided version of the output of the PLL and a phase interpolation control signal;
    generating a second divide control signal and a digital quantization error signal in response to a digital divide ratio using a first sigma-delta modulator, the divide control signal being based on the second divide control signal; and
    generating the phase interpolation control signal based on the digital quantization error using a second sigma-delta modulator, the second sigma-delta modulator having a high bandwidth signal transfer function and being an n-order sigma-delta modulator module, n being an integer greater than one.

8. The method, as recited in claim 7, wherein generating the divide control signal comprises:
    combining an integer portion based on the digital quantization error with an integer portion of the divide ratio.

9. The method, as recited in claim 7, further comprising:
    generating the output signal based on an input clock signal and the phase-adjusted version of the feedback signal.

10. The method, as recited in claim 7, wherein the high bandwidth signal transfer function has unity gain.

11. The method, as recited in claim 7, wherein the first sigma-delta modulator is a first-order sigma-delta modulator and the second sigma-delta modulator is a second order sigma-delta modulator.

12. The method, as recited in claim 7, wherein the divide control signal is based on the second divide control signal and the digital quantization error.

13. The method, as recited in claim 7, further comprising:
    delaying the divide control signal to synchronize the divide control signal and the phase error signal.

14. An apparatus comprising:
    means for generating a frequency-divided version of the output of a phase-locked loop (PLL) responsive to an output of the PLL and a divide control signal;
    means for generating a phase-adjusted version of a feedback signal of the PLL responsive to the frequency-divided version of the output of the PLL and a phase interpolation control signal;
    means for generating a second divide control signal and a digital quantization error signal in response to a digital divide ratio using a first sigma-delta modulator, the divide control signal being based on the second divide control signal; and
    means for generating the phase interpolation control signal based on the digital quantization error using a second sigma-delta modulator, the second sigma-delta modulator having a high bandwidth signal transfer function and being an n-order sigma-delta modulator module, n being an integer greater than one.

15. The apparatus, as recited in claim 14, wherein the signal transfer function of the means for generating the phase interpolation control signal has unity gain.

16. The apparatus, as recited in claim 14, wherein the first sigma-delta modulator is a first-order sigma-delta modulator and the second sigma-delta modulator is a second order sigma-delta modulator.

17. The apparatus, as recited in claim 14, wherein the divide control signal is based on the second divide control signal and the digital quantization error.

\* \* \* \* \*